United States Patent
Ishikawa et al.

(10) Patent No.: US 8,508,258 B2
(45) Date of Patent: Aug. 13, 2013

(54) DRIVER CIRCUIT FOR SWITCHING DEVICE

(75) Inventors: Katsumi Ishikawa, Hitachinaka (JP); Sunao Funakoshi, Kasumigaura (JP); Kozo Sakamoto, Hitachinaka (JP); Hidekatsu Onose, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 212 days.

(21) Appl. No.: 11/657,692

(22) Filed: Jan. 25, 2007

(65) Prior Publication Data
US 2007/0221994 A1 Sep. 27, 2007

(30) Foreign Application Priority Data

Mar. 23, 2006 (JP) ................................. 2006-079907

(51) Int. Cl.
*H03B 1/00* (2006.01)
*H03K 3/00* (2006.01)

(52) U.S. Cl.
USPC .......................................... 327/108; 327/427

(58) Field of Classification Search
USPC .................. 327/108, 427, 434, 423, 424, 556, 327/109–112, 512, 513; 361/18, 20, 113, 361/115
See application file for complete search history.

(56) References Cited

U.S. PATENT DOCUMENTS

| 5,828,112 | A | * | 10/1998 | Yamaguchi | 257/378 |
| 5,909,108 | A | | 6/1999 | He et al. | |
| 6,366,153 | B1 | | 4/2002 | Arslain et al. | |
| 6,373,296 | B1 | | 4/2002 | Auer et al. | |
| 6,650,520 | B2 | * | 11/2003 | He | 361/84 |
| 7,038,415 | B2 | | 5/2006 | Nakamura et al. | |
| 7,176,666 | B2 | * | 2/2007 | Yamamoto | 323/282 |
| 2003/0206040 | A1 | * | 11/2003 | Sakata et al. | 327/108 |
| 2004/0085697 | A1 | | 5/2004 | Kesler et al. | |
| 2004/0178759 | A1 | | 9/2004 | Nakamura et al. | |
| 2005/0041353 | A1 | | 2/2005 | Finney | |
| 2005/0068707 | A1 | | 3/2005 | Takada | |
| 2008/0018377 | A1 | * | 1/2008 | Chung | 327/513 |

FOREIGN PATENT DOCUMENTS

| DE | 102004011441 | 10/2004 |
| DE | 10354443 | 6/2005 |
| EP | 1 050 967 | 5/2000 |
| JP | 2308621 | 12/1990 |
| JP | 10-038964 | 2/1998 |

(Continued)

OTHER PUBLICATIONS

Office Action in German Pat. Appln. No. 10-2007-004-006.9-56, dated May 5, 2010 (in German) with English language translation.
Office Action in DE 10 2007 004 006.9, dated Jul. 27, 2011 (in German), English language translation (3 pgs).

(Continued)

*Primary Examiner* — Lincoln Dononvan
*Assistant Examiner* — Diana J Cheng
(74) *Attorney, Agent, or Firm* — Antonelli, Terry, Stout & Kraus, LLP.

(57) ABSTRACT

A driver circuit that lowers the dependence of the loss in the wide gap semiconductor device upon the temperature is provided. A gate driver circuit for voltage driven power semiconductor switching device includes a power semiconductor switching device, a driver circuit for supplying a drive signal to a gate terminal of the switching device with reference to an emitter control terminal or a source control terminal of the switching device, and a unit for detecting a temperature of the switching device. The temperature of the power semiconductor switching device is detected, and a gate drive voltage or a gate drive resistance value is changed based on the detected temperature.

4 Claims, 7 Drawing Sheets

(56) References Cited

FOREIGN PATENT DOCUMENTS

| | | |
|---|---|---|
| JP | 2002-119044 | 4/2002 |
| JP | 2002-199700 | 7/2002 |
| JP | 2004-274911 | 9/2004 |

OTHER PUBLICATIONS

Office Action in JP 2006-079907, dated Mar. 22, 2011 (in Japanese), partial English language translation.

* cited by examiner

DRIVER CIRCUIT FOR SWITCHING DEVICE

BACKGROUND OF THE INVENTION

The present invention relates to a driver circuit for wide gap semiconductor switching device made of SiC, GaN or the like.

As for the wide gap semiconductor switching devices, silicon carbide (SiC), gallium nitride (GaN) or the like is drawing the attention. These materials have a dielectric breakdown voltage strength that is approximately ten times as high as that of Si, and a drift layer for ensuring the withstand voltage can be made thin to approximately one tenth. Therefore, it is possible to implement a lower on-voltage of power devices. Even in a high withstand voltage region in which only bipolar devices can be used with Si, therefore, it becomes possible to use unipolar devices in wide gap semiconductor devices made of SiC or the like. In Si-IGBTs which form the main stream of power devices at the present time, there is a built-in voltage of approximately 1 V. In MOSFETs and junction-type FETs (abbreviated to JFETs) which are unipolar devices made of SiC, however, devices having no built-in voltage can be obtained.

Figure 2:
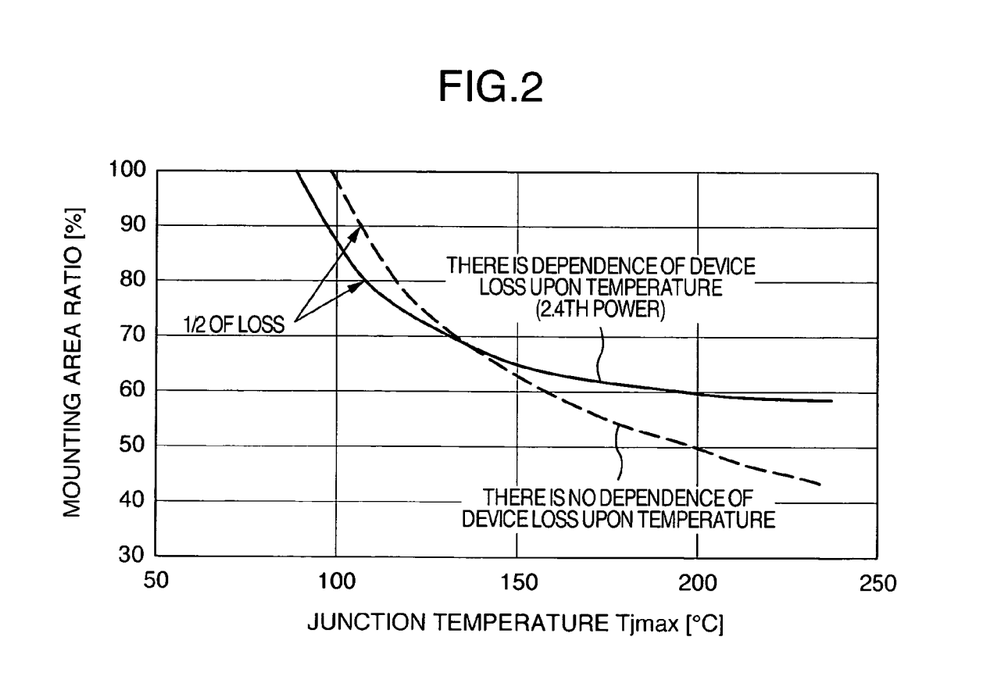
FIG. 2 is a diagram for explaining relations between the junction temperature and the mounting area under different cases of the dependence upon the temperature.

In addition, a SiC substrate indicates a high thermal conductivity and it is a power device that can operate at high temperatures as well. However, it is known that the dependence of the on-resistance upon the temperature is large in unipolar devices. FIG. 2 shows relations between the junction temperature and the mounting area under different cases of the dependence upon the temperature. The loss in a SiC power semiconductor device is set equal to half of that of Si (when Tj=137° C.). A dashed line in FIG. 2 indicates a mounting area ratio in the case where the loss in the power semiconductor device has no dependence upon the temperature. A solid line in FIG. 2 indicates a mounting area ratio in the case where the loss in the power semiconductor device increases in proportion to the 2.4th power of the temperature. If the power semiconductor device having a loss that does not depend upon the temperature is used at a junction temperature of at least 200° C., the mounting area of the power semiconductor device can be made half or less. On the other hand, if the power semiconductor device having a loss that increases in proportion to the 2.4th power of the temperature is used at a junction temperature of at least 200° C., the mounting area of the power semiconductor device must be made at least 60%. Therefore, a control method of detecting the temperature of the power semiconductor device and lowering the dependence of the loss upon the temperature is important.

As for the technique for detecting the temperature of the semiconductor device, a method using a thermistor and a method using a measurement result of the on-voltage of a temperature detecting diode formed in a Si-IGBT are known as methods typically used in intelligent power modules and so on are well known. The method using the temperature detecting diode is disclosed in JP-A-10-38964.

SUMMARY OF THE INVENTION

In the conventional technique, the temperature of the Si device is detected. If the device temperature becomes high, control is exercised to cause protection operation in which a semiconductor device such as an IGBT (Insulated-Gate Bipolar Transistor) is cut off or lower the temperature of the semiconductor device such as the IGBT by changing the duty factor of the input PWM (Pulse-Width Modulation) signal. However, the wide gap semiconductor device made of SiC or the like can operate at high temperatures as well. In the wide gap semiconductor device made of SiC or the like, therefore, it is important to exercise control to detect the temperature of the power semiconductor device and lower the dependence of the loss upon the temperature.

An object of the present invention is to provide a driver circuit that lowers the dependence of the loss in the wide gap semiconductor device upon the temperature.

A gate driver circuit for voltage driven power semiconductor switching device according to the present invention includes a power semiconductor switching device, a driver circuit for supplying a drive signal to a gate terminal of the switching device with reference to an emitter control terminal or a source control terminal of the switching device, and a unit for detecting a temperature of the switching device. The temperature of the power semiconductor switching device is detected, and a gate drive voltage or a gate drive resistance value is changed based on the detected temperature. Specifically, the temperature of the power semiconductor switching device is detected, and if the detected temperature is high, the gate drive voltage is raised or the gate drive resistance value is reduced.

According to the gate driver circuit for power semiconductor device, it is possible to make the wide gap semiconductor device made of SiC or the like operate up to high temperatures, make the mounting area of the power semiconductor device small, and make the size of the semiconductor apparatus small.

Other objects, features and advantages of the invention will become apparent from the following description of the embodiments of the invention taken in conjunction with the accompanying drawings.

DESCRIPTION OF THE EMBODIMENTS

Embodiments of the present invention will be described in detail with reference to the drawings.

First Embodiment

Figure 1:
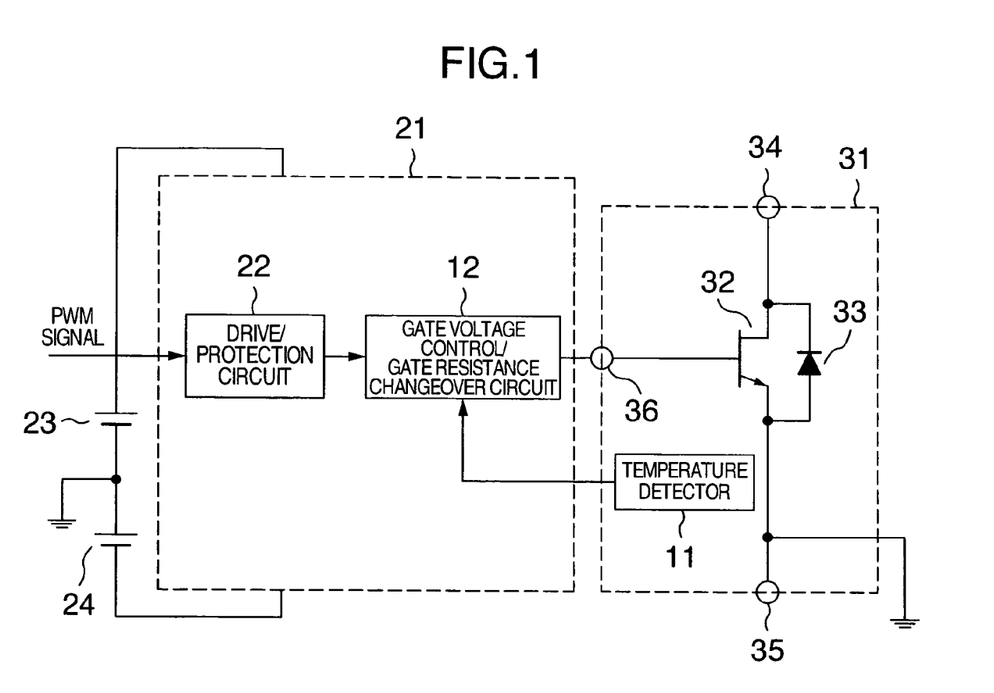
FIG. 1 is a block diagram of a driver circuit for power semiconductor device according to a first embodiment.

FIG. 1 shows a block diagram of a driver circuit for power semiconductor device according to a first embodiment. The reference numeral 23 indicates a positive bias power source for a driver circuit 21 and the reference numeral 24 indicates a negative bias power source for the driver circuit 21. A power module 31 shown in FIG. 1 is connected to the driver circuit 21. In the power module 31, a freewheeling diode 33 is connected in parallel with a SiC junction-type FET (SiC-JFET) 32 which is a wide gap semiconductor switching device.

In the present embodiment, a temperature detector 11 in the power module and a gate voltage control/gate resistance changeover circuit 12 are provided. A drive/protection circuit 22 is also provided. The temperature of the power semiconductor switching device is detected. If the detected temperature is higher than a predetermined temperature, the gate drive voltage is raised or the gate drive resistance is reduced.

Figure 3:
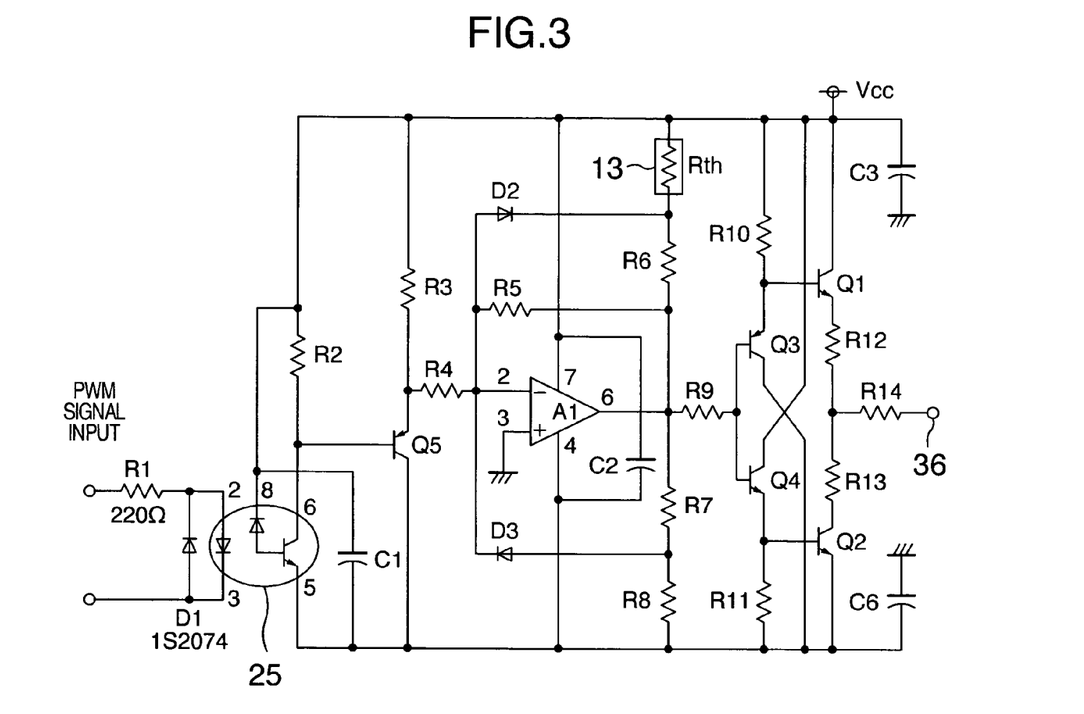
FIG. 3 is a circuit diagram of the driver circuit for power semiconductor device according to the first embodiment.
Figure 4:
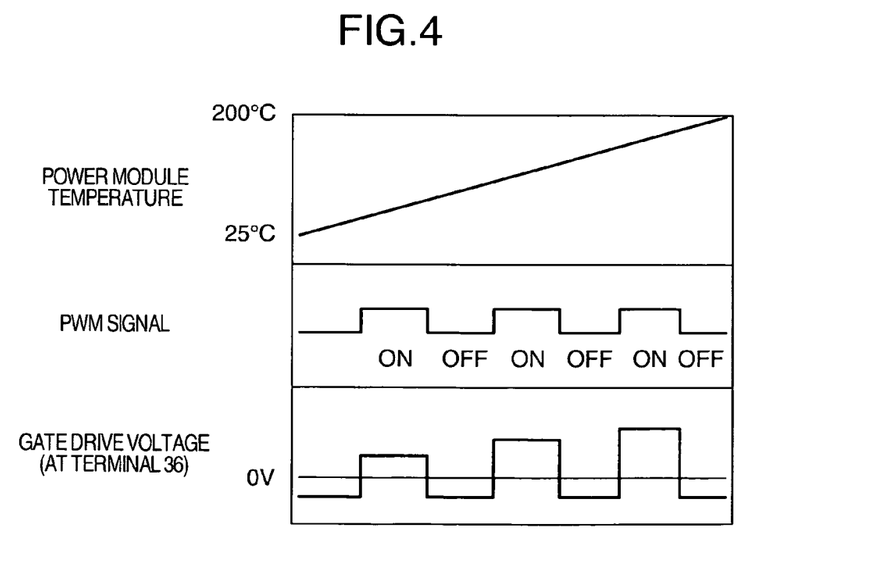
FIG. 4 is a diagram for explaining a gate voltage waveform in the driver circuit for power semiconductor device according to the first embodiment.

FIG. 3 is a circuit diagram of the driver circuit for power semiconductor device according to the present embodiment. The reference numeral 25 indicates a photocoupler. A thermistor 13 shown in FIG. 3 is disposed within the power module to detect the temperature of the power device. This circuit has a configuration for controlling the gate drive voltage by using an operational amplifier A1, the thermistor 13 and a resistor R6. A drive voltage at a gate terminal 36 depends on Vcc×R6/(R6+Rth). FIG. 4 shows a gate voltage waveform in the driver circuit for power semiconductor device according to the present embodiment. As shown in FIG. 4, the gate drive voltage can rise as the power module temperature rises. As a result, the loss at the time of high temperatures can be reduced. Therefore, it is possible to make the wide gap semiconductor device made of SiC or the like operate up to high temperatures, make the mounting area of the power semiconductor device small, and make the size of the semiconductor apparatus small.

Second Embodiment

Figure 5:
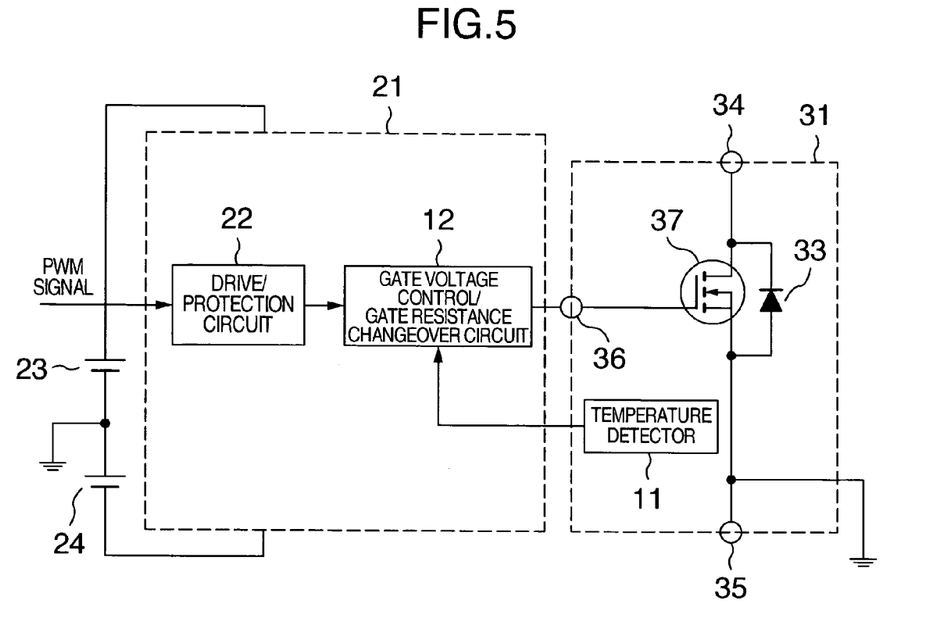
FIG. 5 is a block diagram of a driver circuit for power semiconductor device according to a second embodiment.

FIG. 5 shows a block diagram of a driver circuit for power semiconductor device according to a second embodiment. The second embodiment differs from the first embodiment in a wide gap semiconductor switch device. In the present embodiment, a SiC-MOSFET 37 is used as shown in FIG. 5. If the SiC-MOSFET 37 is used, a body diode is incorporated and consequently there is no problem without the freewheeling diode 33.

This embodiment provides a device having large dependence of the on-resistance upon the temperature with very effective control unit. Among wide gap semiconductors made of SiC or the like, the unit is effective especially to driver circuits for junction-type FETs (SiC-JFETs) and MOSFETs. In bipolar transistors and IGBTs of wide gap semiconductor made of SiC or the like as well, however, the switching loss increases as the temperature rises. Accordingly, the total loss (conduction loss+turn-on loss+turn-off loss) at the time of high temperatures is reduced by applying the circuit according to the present embodiment. Therefore, it is possible to make the wide gap semiconductor device made of SiC or the like operate up to high temperatures, make the mounting area of the power semiconductor device small, and make the size of the semiconductor apparatus small.

As for wide gap semiconductors, there are GaN and diamond besides SiC. The driver circuit according to the present embodiment can be applied to these semiconductor devices as well. Furthermore, if the dependence of the device loss upon the temperature is large, the loss at the time of high temperatures can be reduced by applying the present embodiment even in semiconductor devices made of Si or the like. In the same way as the wide gap semiconductors, it is possible to make the mounting area of the power semiconductor device small and make the size of the semiconductor apparatus small.

Third Embodiment

Figure 6:
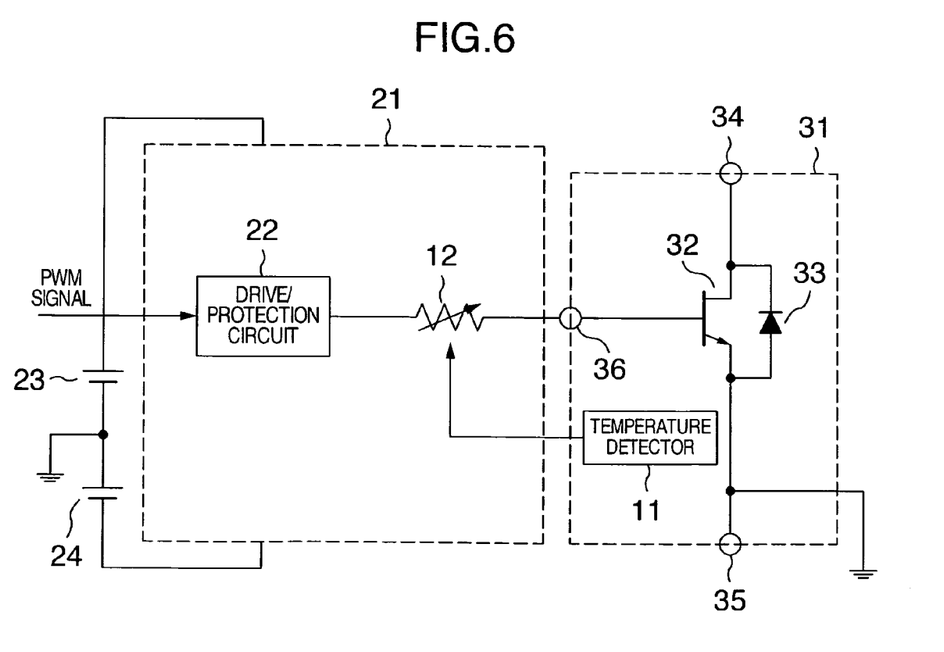
FIG. 6 is a block diagram of a driver circuit for power semiconductor device according to a third embodiment.

FIG. 6 shows a block diagram of a driver circuit for power semiconductor device according to a third embodiment. The same components as those in the first embodiment are denoted by like reference numerals. The present embodiment has a configuration for detecting the temperature of the power module and varying the gate resistance.

Figure 7:
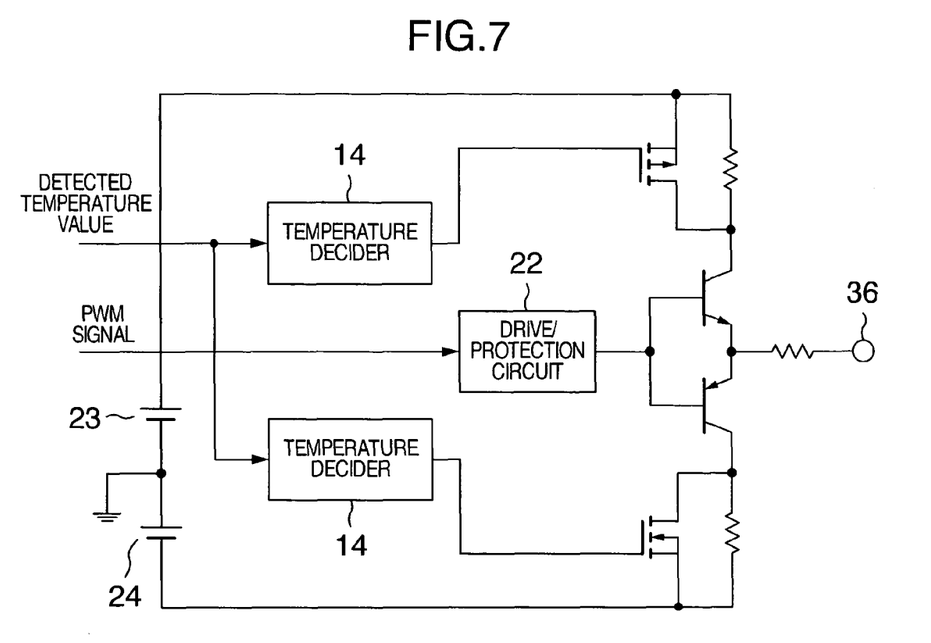
FIG. 7 is a circuit diagram of the driver circuit for power semiconductor device according to the third embodiment.

FIG. 7 shows a circuit diagram of the driver circuit for power semiconductor device according to the present embodiment. The same components as those in the first embodiment are denoted by like reference numerals. In the present embodiment, temperature deciders 14 are provided as shown in FIG. 7. If the temperature of the device in the power module is high, then MOSFETs shown in FIG. 7 are turned on to reduce the gate resistance. At the time of drive at high temperatures, therefore, the gate resistance is reduced and consequently it is possible to raise the speed of di/dt and dv/dt and reduce the loss in the power device. At the time of turn off as well, it is possible to raise the speed of di/dt and dv/dt and reduce the switching loss when driving the power device at the time of high temperatures by using a similar configuration.

In the present embodiment, an output of each temperature decider 14 turns on one MOSFET and consequently short-circuits a resistor as shown in FIG. 7. Alternatively, multi-stage control using a combination of at least two temperature deciders, MOSFETs and resistors is also possible. As a result, the loss at the time of high temperatures can be reduced. Therefore, it is possible to make the wide gap semiconductor device made of SiC or the like operate up to high temperatures, make the mounting area of the power semiconductor device small, and make the size of the semiconductor apparatus small.

Fourth Embodiment

Figure 8:
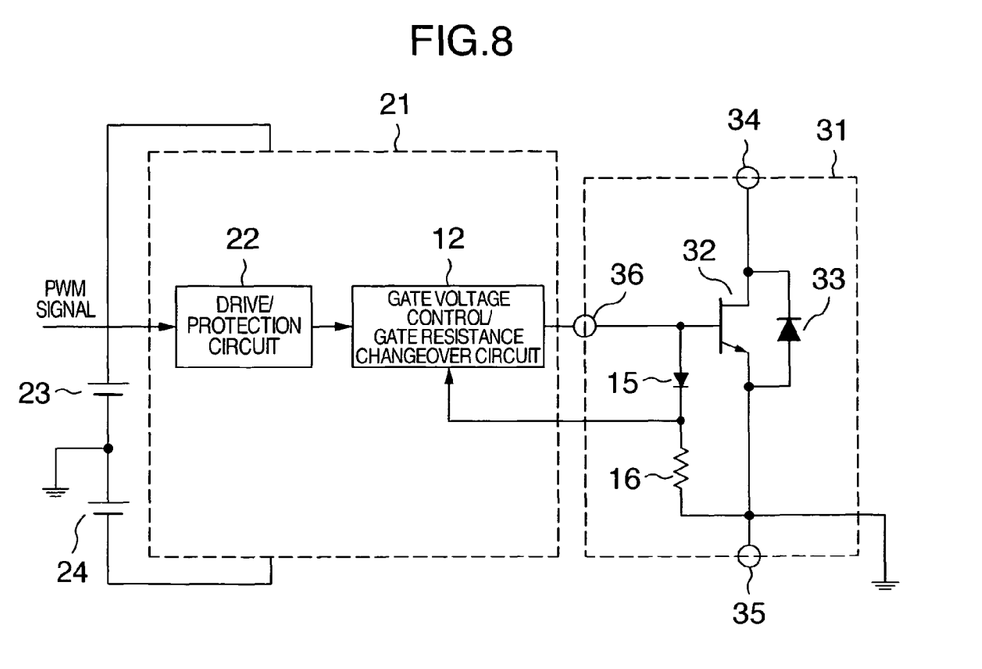
FIG. 8 is a block diagram of a driver circuit for power semiconductor device according to a fourth embodiment.

FIG. 8 shows a block diagram of a driver circuit for power semiconductor device according to a fourth embodiment. The same components as those in the first embodiment are denoted by like reference numerals. In the present embodiment, a diode 15 for detecting the temperature and a resistor 16 for detecting the gate current are connected between source and gate terminals of the power module. The diode 15 and the resistor 16 may be incorporated in the wide gap semiconductor, or may be mounted on a different chip. For measuring the chip temperature accurately, however, it is desirable to incorporate them in the wide gap semiconductor.

Figure 9:
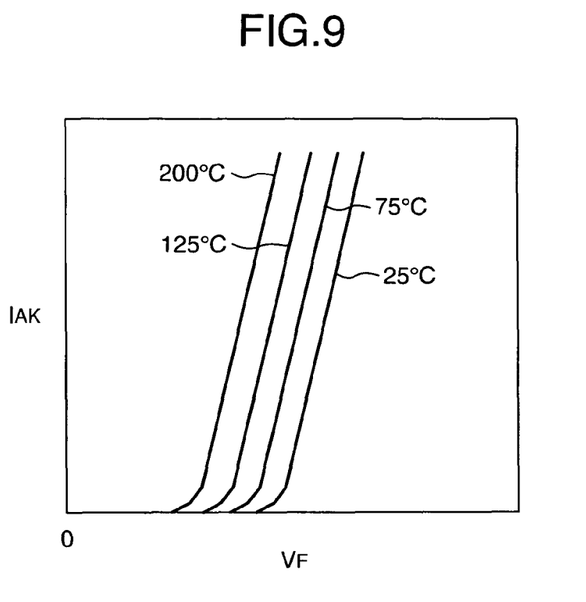
FIG. 9 is a diagram for explaining current-voltage characteristics of a diode for detecting the temperature.

FIG. 9 shows current-voltage characteristics of the diode 15 for detecting the temperature. If the temperature rises, then the current-voltage characteristics of the diode 15 for detecting the temperature change. If the gate voltage is constant, the anode-cathode (AK) current increases. Therefore, the AK current is detected and the speed of di/dt and dv/dt is raised by a gate voltage control/gate resistance changeover circuit 12 to reduce the loss in the power device.

Fifth Embodiment

Figure 10:
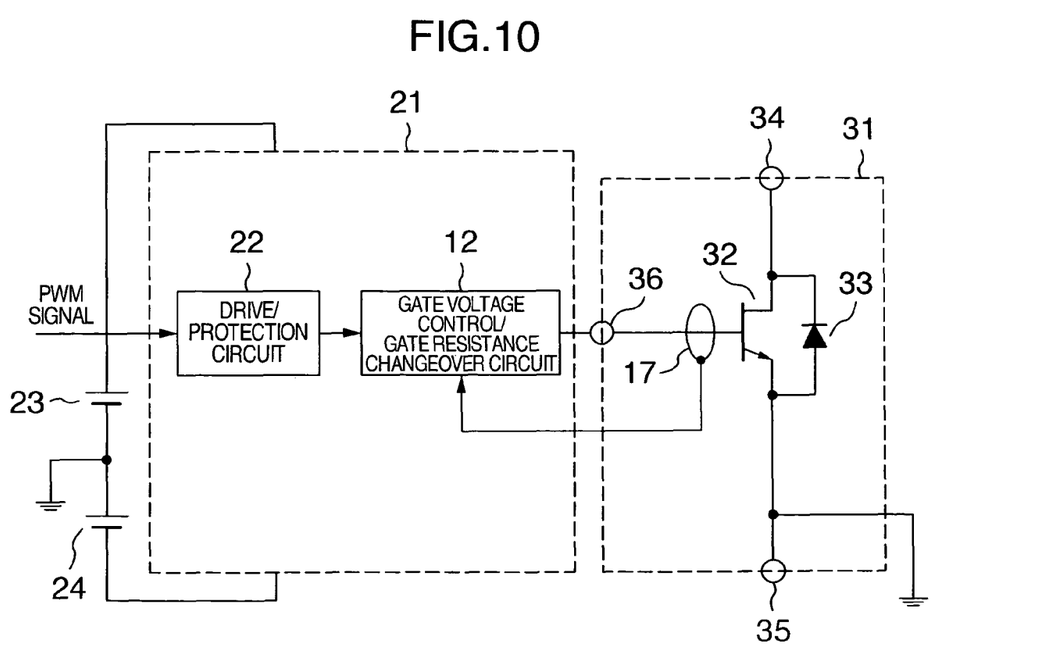
FIG. 10 is a block diagram of a driver circuit for power semiconductor device according to a fifth embodiment.

FIG. 10 shows a block diagram of a driver circuit for power semiconductor device according to a fifth embodiment. The same components as those in the fourth embodiment are denoted by like reference numerals. In the present embodiment, a current transformer 17 for detecting the gate current is provided.

Figure 11:
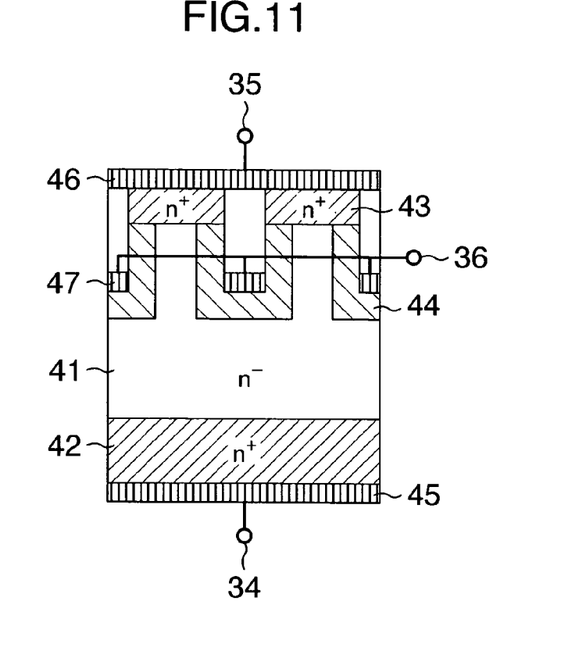
FIG. 11 is a diagram for explaining a section of a SiC junction-type FET 32 according to the fifth embodiment.

FIG. 11 shows a device section structure of a SiC junction-type FET 32 according to the present embodiment. An $n^+$ layer 42 and a drain electrode 45 are formed on a drain side of a SiC substrate 41 and connected to a drain terminal 34. On the other hand, an $n^+$ layer 43 and a source electrode 46 are formed on a source side of the SiC substrate 41 and connected to a source terminal 35. In addition, a $p^+$ layer 44 and a gate electrode 47 are formed in the SiC substrate 41 and connected to a gate terminal 36. In this structure, a parasitic diode is formed between the gate and the source. Therefore, the gate current is detected by using the current transformer 17 for gate current detection, and the gate voltage is raised or the gate resistance is reduced by the gate voltage control/gate resistance changeover circuit 12. As a result, the loss in the power device is reduced.

Sixth Embodiment

Figure 12:
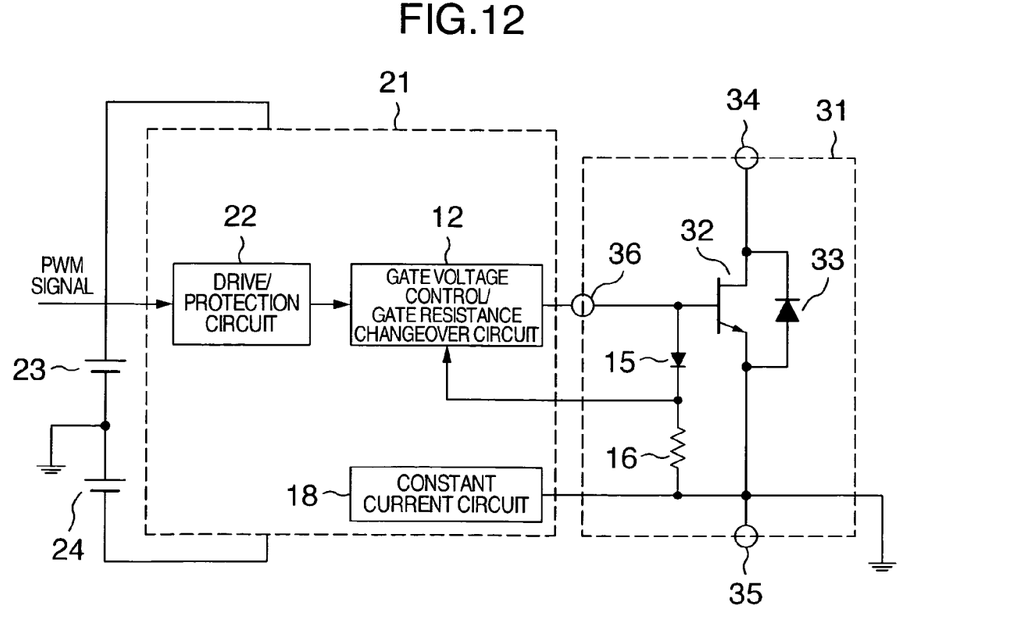
FIG. 12 is a block diagram of a driver circuit for power semiconductor device according to a sixth embodiment.

FIG. 12 is a block diagram of a driver circuit for power semiconductor device according to a sixth embodiment. The same components as those in the fourth embodiment are denoted by like reference numerals. In the present embodiment, a constant current circuit 18 is provided in the driver circuit 21.

Figure 13:
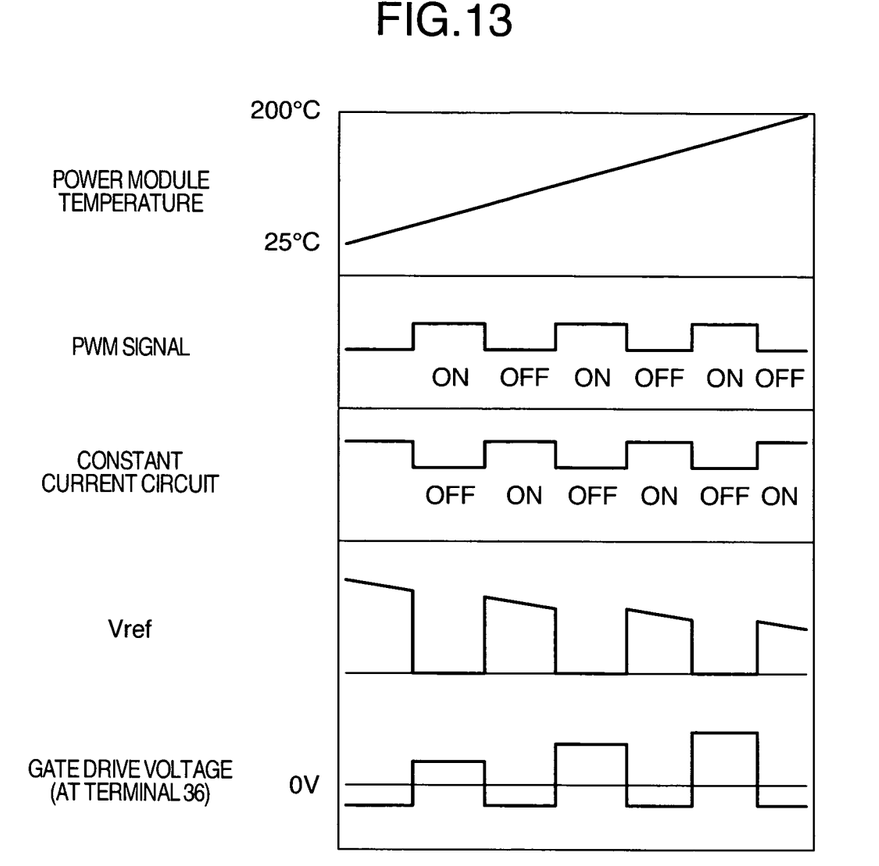
FIG. 13 is a diagram for explaining operation waveforms in a driver circuit for power semiconductor device according to the sixth embodiment.

FIG. 13 shows operation waveforms in the driver circuit for power semiconductor device according to the present embodiment. The diode 15 for detecting the temperature and the resistor 16 for detecting the gate current are connected between source and gate terminals of the power module. The constant current circuit 18 is brought into operation during an off-period of a PWM signal. The temperature of the power device is detected by measuring a voltage across the resistor 16 for gate current detection. The detected voltage is fed back to the gate voltage control/gate resistance changeover circuit 12 to raise the gate voltage. As a result, the loss at the time of high temperatures can be reduced. In the present embodiment, therefore, it is possible to make the wide gap semiconductor device operate up to high temperatures, make the mounting area of the power semiconductor device small, and make the size of the semiconductor apparatus small.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A gate driver circuit for a wide gap type power semiconductor switching device, comprising, a driver circuit for supplying a drive signal to a gate terminal of the switching device with reference to an emitter control terminal or a source control terminal of the switching device, and a diode between the emitter control terminal or the source control terminal of the power semiconductor switching device and the gate terminal of the power semiconductor switching device, wherein:
a temperature of the power semiconductor switching device is detected based on a forward voltage drop of the diode, in response to an increase in the detected temperature, the drive circuit raises a gate drive voltage or reduces a gate drive resistance value to adjust the drive signal to continue driving the switching device with an increased drive signal to decrease dependence of loss in the wide gap type semiconductor switching device upon the increase in the detected temperature, wherein the wide gap type power semiconductor switching device is comprised of a SiC or a GaN wide gap type power semiconductor switching device, wherein a detection operation of the forward voltage drop of the diode is conducted during an off-period of the power semiconductor switching device, and wherein the off period of the power semiconductor switching device is a period based on an off signal of a PWM signal which alternates between an on signal and the off signal.

2. The gate driver circuit according to claim 1, wherein the circuit further comprises a constant current circuit coupled to the collector/emitter path or the source/drain path of the power semiconductor switching device and to the diode, wherein the constant current circuit is configured to be brought into and ON state when the PWM signal is an OFF signal and to be brought into an OFF state when the PWM signal is an ON signal.

3. A gate driver circuit for a wide gap type power semiconductor switching device, comprising, a driver circuit for supplying a drive signal to a gate terminal of the switching device with reference to an emitter control terminal or a source control terminal of the switching device, and a diode between the emitter control terminal or the source control terminal of the power semiconductor switching device and the gate terminal of the power semiconductor switching device, wherein:
a temperature of the power semiconductor switching device is detected based on a forward voltage drop of the diode, in response to an increase in the detected temperature, the drive circuit raises a gate drive voltage or reduces a gate drive resistance value to adjust the drive signal to continue driving the switching device with an increased drive signal to decrease dependence of loss in the wide gap type semiconductor switching device upon the increase in the detected temperature, wherein the wide gap type power semiconductor switching device is comprised of a SIC or a GaN wide gap type power semiconductor switching device, wherein a detection operation of the forward voltage drop of the diode is conducted during an off-period of the power semiconductor switching device, and wherein the off period of the power semiconductor switching device is a period based on an off signal of a PWM signal which alternates between an on signal and the off signal, wherein the diode is incorporated in the power semiconductor switching device, and wherein the power semiconductor switching device is comprised of a junction type FET (Field Effect Transistor) and the diode is comprised of a parasitic diode formed between a gate and a source of the junction type FET.

4. The gate driver circuit according to claim 3, wherein the circuit further comprises a constant current circuit coupled to the collector/emitter path or the source/drain path of the power semiconductor switching device and to the diode, wherein the constant current circuit is configured to be brought into and ON state when the PWM signal is an OFF signal and to be brought into an OFF state when the PWM signal is an ON signal.

* * * * *